(12) United States Patent
Chang et al.

(10) Patent No.: US 7,808,037 B2
(45) Date of Patent: Oct. 5, 2010

(54) HIGH VOLTAGE DEVICE

(75) Inventors: Hsin Wen Chang, Miaoli (TW); Yao Wen Chang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 56 days.

(21) Appl. No.: 11/303,176

(22) Filed: Dec. 16, 2005

(65) Prior Publication Data
US 2007/0138552 A1    Jun. 21, 2007

(51) Int. Cl.
*H01L 29/94* (2006.01)
(52) U.S. Cl. ............... 257/327; 257/344; 257/E29.278
(58) Field of Classification Search ............... 257/327, 257/344, E29.278
See application file for complete search history.

(56) References Cited

U.S. PATENT DOCUMENTS

| | | | |
|---|---|---|---|
| 4,912,061 A | | 3/1990 | Nasr |
| 5,349,225 A | * | 9/1994 | Redwine et al. ............. 257/336 |
| 5,430,313 A | * | 7/1995 | Kumagai et al. ............. 257/327 |
| 5,478,759 A | * | 12/1995 | Mametani et al. ........... 438/228 |
| 5,719,425 A | * | 2/1998 | Akram et al. ............... 257/344 |
| 6,350,641 B1 | | 2/2002 | Yang |
| 6,551,870 B1 | | 4/2003 | Ling et al. |
| 6,593,197 B2 | | 7/2003 | Wieczorek et al. |
| 6,624,028 B1 | | 9/2003 | Wen |
| 6,831,337 B2 | * | 12/2004 | Wu et al. ................... 257/408 |
| 2003/0038308 A1 | * | 2/2003 | Kim ............................ 257/288 |
| 2003/0116785 A1 | * | 6/2003 | D'Anna et al. .............. 257/200 |
| 2003/0228721 A1 | * | 12/2003 | Efland et al. ................ 438/140 |
| 2004/0173867 A1 | * | 9/2004 | Beigel ........................ 257/500 |

FOREIGN PATENT DOCUMENTS

| | | |
|---|---|---|
| TW | 512440 | 12/2002 |
| TW | I302719 | 5/2007 |

OTHER PUBLICATIONS

Wiley Encyclopedia of Electrical and Electronics Engineering, "Hot Carriers" article by Timothy A. Grotjohn (copyright 1999), pp. 1-24.*

* cited by examiner

*Primary Examiner*—Bradley K Smith
*Assistant Examiner*—Alexander Belousov
(74) *Attorney, Agent, or Firm*—Jianq Chyun IP Office

(57) ABSTRACT

A high-voltage semiconductor device includes a silicon substrate having a main surface, a gate on the main surface of the silicon substrate, a source region in a portion of the silicon substrate proximate the main surface and a drain region in a portion of the silicon substrate proximate the main surface. The drain region is spaced apart from the source region. A channel region is defined in a portion of the silicon substrate proximate the main surface between the source region and the drain region. The channel region is at least partially beneath the gate. An additional region is disposed on the main surface proximate the channel region. The additional region being formed of one of a high-k material and a conductive material.

11 Claims, 6 Drawing Sheets

HIGH VOLTAGE DEVICE

BACKGROUND OF THE INVENTION

The present invention relates to a high voltage semiconductor device, and more particularly, to a high voltage semiconductor device having an additional region next to a gate electrode, which may be a high dielectric constant (high-k) dielectric such as nitride or a conductor such as polysilicon and a method for manufacturing such a high voltage semiconductor device having an additional nitride or polysilicon region.

Metal oxide semiconductor (MOS) transistor devices are generally known in the art. A metal oxide semiconductor field effect transistor (MOSFET) is a widely used type of field effect transistor (FET). MOSFETs can either be n-channel (NMOS) or p-channel (PMOS) transistors, and may be utilized for high power applications. When a voltage is applied between a gate and source terminal of the MOS, an electric field generated penetrates through an oxide layer and creates a so-called "inversion channel" in a channel underneath the gate. The inversion channel is of the same type, i.e., p-type or n-type, as the source and drain, so it provides a conduit through which current can pass.

In NMOS transistors, the silicon channel between the source and the drain of the device is p-type silicon. When a voltage larger than a threshold voltage is placed on the gate electrode, electrons in the p-type material are inverted and then "conduct" through the channel turning the device "ON." Conversely, when a voltage less than a threshold voltage is applied to the gate, the device turns "OFF." In PMOS transistors, the silicon channel between the source and the drain of the device is n-type silicon. In a CMOS, no power flows until the transistors switch.

FIG. 1A shows a typical prior art symmetric high voltage metal oxide semiconductor (MOS) device 100 having an oxide fill 111. The MOS device 100 includes a semiconductor substrate 102, a source 104, a drain 112, a gate 125 and a channel region 105. The source 104 has a metal or polysilicon contact 104a, and the drain 112 also has a metal or polysilicon contact 112a. The oxide fill 111 surrounds at least the sides of the gate 125 and covers at least a portion of a main surface 102a of the semiconductor substrate 102. The MOS device 100 includes lightly doped regions 126, 128 in the semiconductor substrate 102 between the gate 125 and the source 104 and the drain 112, respectively. Similarly, FIG. 1B shows a typical prior art asymmetric high voltage MOS device 100 having similar attributes.

FIG. 2 is a graph of drain current $I_d$ versus drain voltage $V_d$ for the prior art high voltage MOS device 100 demonstrating "quasi-saturation effect" which occurs with increasing gate voltage. The drain current of the high voltage MOS device 100 saturates with increasing gate voltage $V_g$ due to carriers in the n− region 128 reaching saturation velocity which thereby determines saturation current. By increasing n− dosage, quasi-saturation currents can be enhanced, but this solution undesirably decreases the breakdown voltage of a high voltage MOS device 100.

FIG. 3 shows gate fringing electrical field lines of the prior art high voltage MOS device 100. The existence of the fringing electrical field makes the additional gate voltage dependence of the carrier concentration in the n− region 128. FIG. 4 is a graph of electron concentration versus position in a channel for the prior art high voltage MOS device 100 demonstrating increasing carrier concentrations with increasing gate voltage $V_g$. Carrier concentrations in the lightly doped regions 126, 128 increase with increasing gate voltage $V_g$ because of the gate fringing electric field. That is why there is still minor gate voltage dependence on drain current $I_d$ even though the high voltage MOS device enters quasi-saturation region.

It is desirable to provide a high voltage MOS device having enhanced gate fringing electrical fields and increased quasi-saturation current as compared to conventional high voltage MOS devices. This can be achieved by providing a high voltage MOS device having an additional region next to its gate electrode, which may be a high-k dielectric such as nitride or a conductor such as polysilicon.

BRIEF SUMMARY OF THE INVENTION

Briefly stated, the present invention comprises a high-voltage semiconductor device that includes a silicon substrate having a main surface, a gate on the main surface of the silicon substrate, a source region in a portion of the silicon substrate proximate the main surface and a drain region in a portion of the silicon substrate proximate the main surface. The drain region is spaced apart from the source region. A channel region is defined in a portion of the silicon substrate proximate the main surface between the source region and the drain region. The channel region is at least partially beneath the gate. An additional region of one of high-k dielectric and conductive material is disposed on the main surface proximate the channel region. The one of high-k dielectric and conductive material can be, for example, nitride or polysilicon, respectively.

In another aspect, the present invention comprises a method of forming a method for forming a high-voltage semiconductor device. The method includes providing a silicon substrate having a main surface. A gate is formed on the main surface of the silicon substrate. A source region is formed in a portion of the silicon substrate proximate the main surface, and a drain region is formed in a portion of the silicon substrate proximate the main surface. The drain region is spaced apart from the source region. A channel region is defined in a portion of the silicon substrate proximate the main surface between the source region and the drain region. An additional layer of one of high-k dielectric (e.g., nitride) and a conductive material (e.g., polysilicon) is deposited on the main surface of the substrate. The layer is selectively etched so as to leave at least a portion of the additional layer on the main surface of the semiconductor substrate proximate the channel region.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1A:
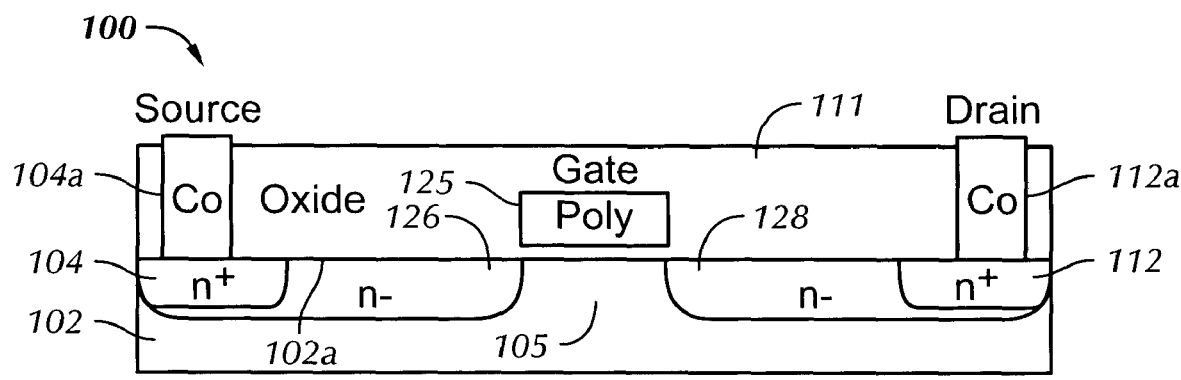
FIG. 1A is a partial elevational cross-sectional view of a prior art symmetric high voltage metal oxide semiconductor (MOS) device.
Figure 1B:
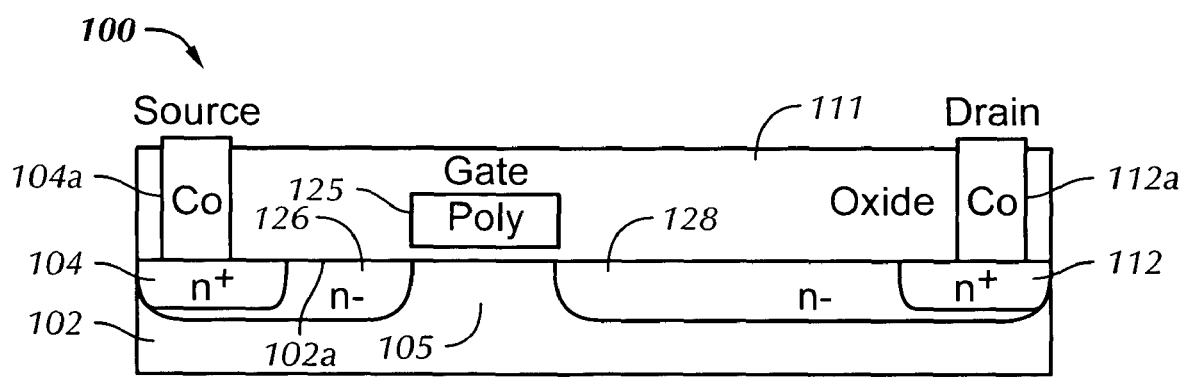
FIG. 1B is a partial elevational cross-sectional view of a prior art asymmetric high voltage MOS device

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a," as used in the claims and in the corresponding portions of the specification, means "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively.

Figure 5A:
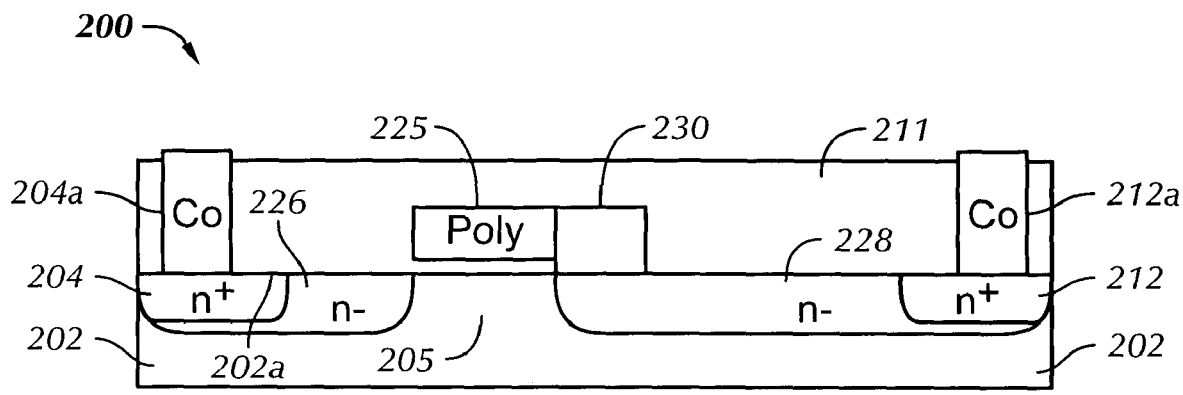
FIG. 5A is a partial elevational cross-sectional view of a high voltage metal oxide semiconductor (MOS) device having an additional region filled with one of a high dielectric constant (high-k) material and a conductive material to enhance the gate controllability on carrier concentration in n− region in accordance with a preferred embodiment of the present invention.
Figure 5B:
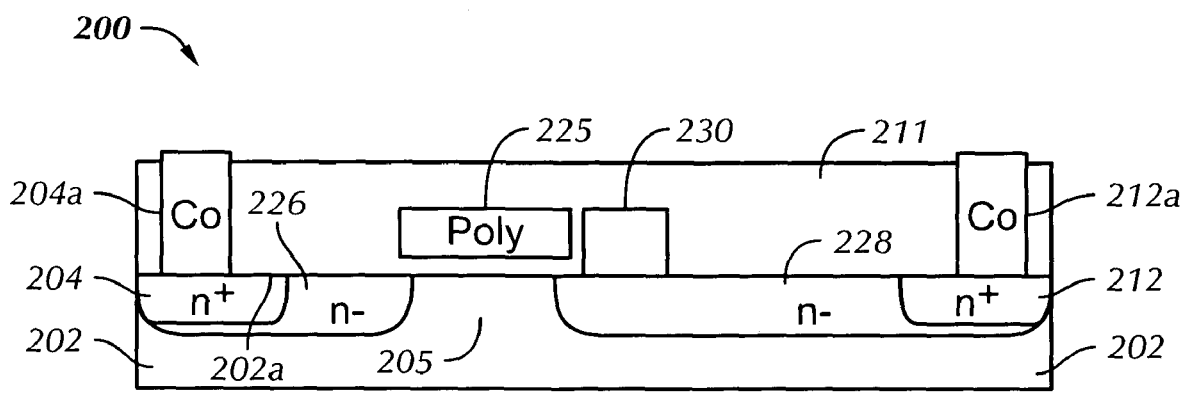
FIG. 5B is a partial elevational cross-sectional view of the high voltage MOS device of FIG. 5B where the additional region is spaced apart from the gate.

However, such relative doping terms should not be construed as limiting. Referring to the drawings in detail, wherein like numerals reference indicate like elements throughout, there is shown in FIGS. 5A-5B a high voltage metal oxide semiconductor (MOS) device 200 having an additional region 230, which may be filled with a high-dielectric-constant (high-k) material, such as silicon nitride ($S_xN_y$), aluminum oxide ($Al_xO_y$), hafnium oxide ($Hf_xO_y$) or the like, or may be a conductive material such as polysilicon ($Si_x$) ("poly"), in accordance with a preferred embodiment of the present invention. The high voltage MOS device 200 includes lightly doped regions 226, 228 in the semiconductor substrate 202 between the gate 225 and the source 204 and the drain 212, respectively. The high voltage MOS device 200 may include a dielectric or oxide layer 211. The additional region 230 is used to enhance the controllability of gate electrode 225 on the carrier concentration in n− region 226, 228. The high voltage MOS device 200 includes a semiconductor substrate 202, a source 204, a drain 212, a gate 225 and a channel region 205. The gate 225 is formed of polysilicon or a metal or combinations thereof as is known. The source 204 has a metal or polysilicon contact 204a, and the drain 212 also has a metal or polysilicon contact 212a. As shown in FIGS. 5A-5B, the substrate 202 is a p-type substrate, the source 204 and the drain 212 are heavily doped n-type ($n^+$) and the lightly doped regions 226, 228 are lightly doped n-type ($n^-$).

The additional region 230 is disposed proximate to the sides of the gate 225 and covers at least a portion of a main surface 202a of the semiconductor substrate 202. In FIG. 5A, the additional region 230 is generally adjacent to the control gate 225. FIG. 5B shows a variation where the additional region 230 is disposed proximate to the control gate 225, but is generally spaced apart from the control gate 225 by a predetermined distance.

Figure 2:
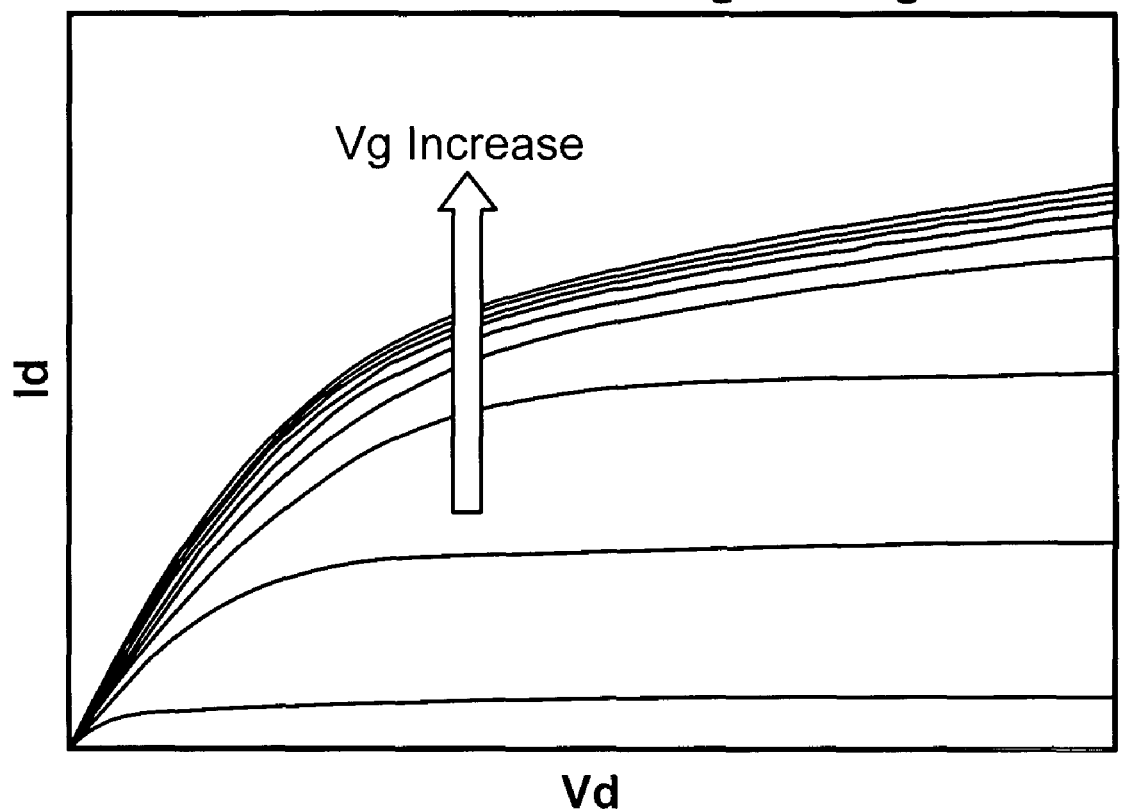
FIG. 2 is a graph of drain current versus drain voltage for the prior art high voltage MOS device of FIG. 1 demonstrating quasi-saturation effect with increasing gate voltage.

FIG. 2 is a graph of drain current $I_d$ versus drain voltage $V_d$ for a high voltage MOS device 100 under different gate voltage $V_g$. When gate voltage is low, the drain current increases apparently with increasing gate voltage as normal MOS devices 100. But, when gate voltage $V_g$ exceeds a specific criterion, which is dominated by the process and device structure, the current increment with increasing gate voltage $V_g$ becomes much less. It is the so-called "quasi-saturation effect."

Quasi-saturation effect may be interpreted as follows. When gate voltage $V_g$ is low, the intrinsic channel resistance (the part under the poly gate 125, which is controlled by gate voltage $V_g$) is larger than the series resistances of n− regions 126, 128. In this condition, most of voltage drop from large drain voltage $V_d$ is on the intrinsic MOS device 100. The intrinsic MOS part dominates the behavior of the high voltage MOS device 100 and it enters the saturation region as normal MOS devices. But, when gate voltage $V_g$ continuously increases, the intrinsic channel resistance will decrease due to the increasing inversion charges under the gate 125 induced by gate voltage $V_g$. When gate voltage $V_g$ exceeds a specific criterion, the intrinsic channel resistance is much smaller than the series resistances of n− regions 126, 128. In this condition, most of voltage drop from large drain voltage $V_d$ will be on n−resistance instead. Large voltage drop induces very large electrical field in the n− region 126, 128 and make the carriers in the n-region 126, 128 reach saturation velocity. At the same time, the n− region 126, 128 dominates the drain current $I_d$ instead of the intrinsic channel region 105. It will be proportional to the product of the carrier concentration in n− region 126, 128 and the velocity of the carriers. Since the carrier concentration in n− region 126, 128 is almost constant, the drain current $I_d$ will stay almost the same because the velocity has reached its saturation velocity no matter how the gate voltage $V_g$ continuously increases. Because the drain current $I_d$ is proportional to the product of carrier concentration and saturation velocity in n− region 126, 128 when the high voltage MOS device 100 enters quasi-saturation region, increasing n− dosage can effectively enhance the quasi-saturation currents. However, this solution undesirably decreases the breakdown voltage of a high voltage MOS device 100.

Figure 3:
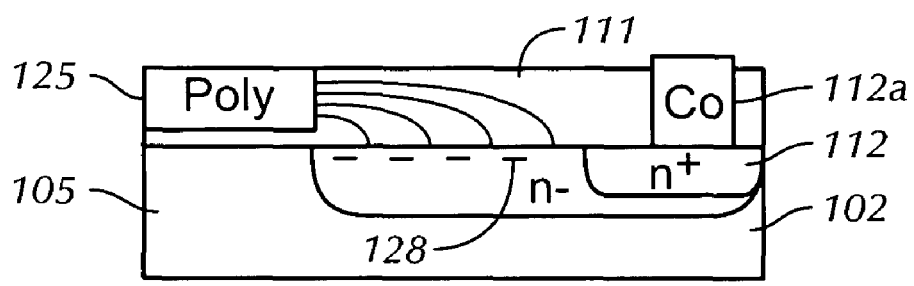
FIG. 3 is a partial elevational cross-sectional view of a prior art high voltage MOS device showing gate fringing electrical field lines.
Figure 4:
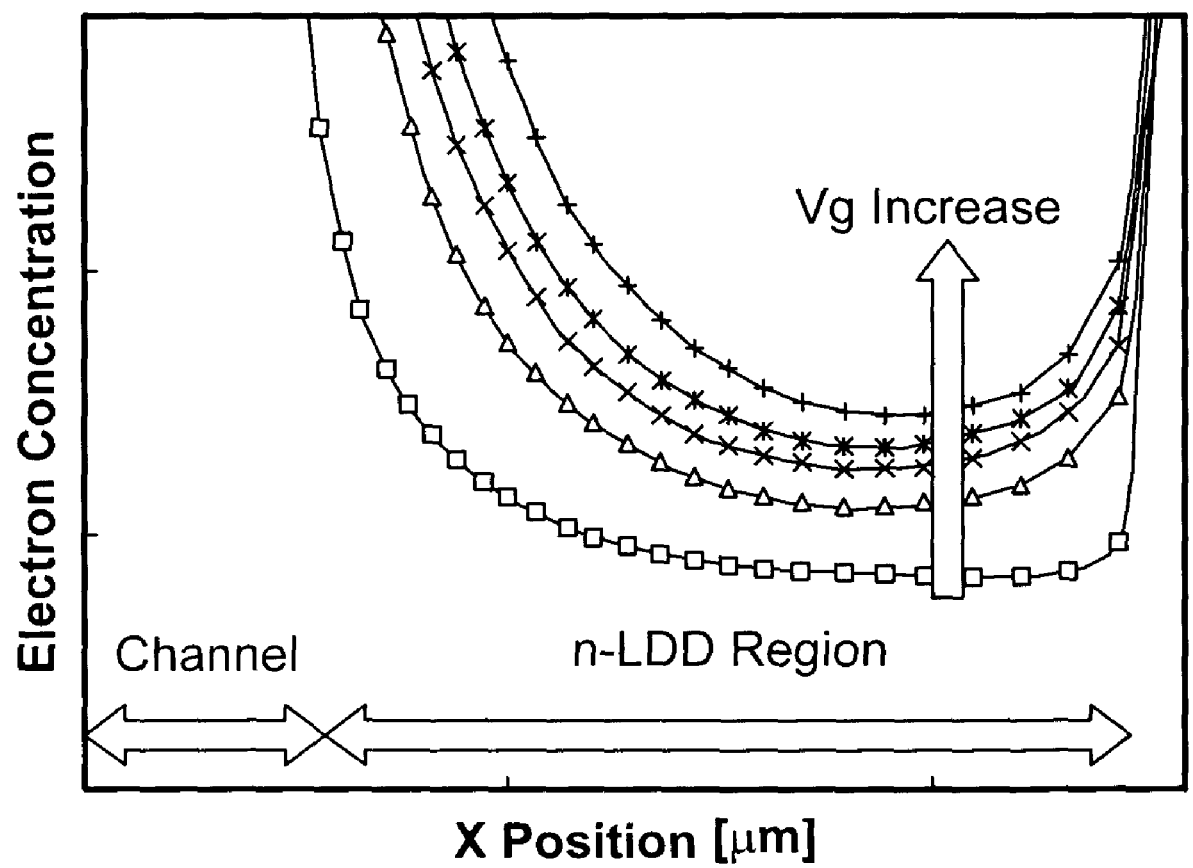
FIG. 4 is a graph of electron concentration versus position in a channel for the prior art high voltage MOS device of FIG. 1 demonstrating increasing carrier concentrations with increasing gate voltage.

In theory, drain current $I_d$ should be a constant when a high voltage MOS device 100 enters the quasi-saturation region, independent of the gate voltage $V_g$. Nevertheless, minor gate voltage dependence still can be found in FIG. 2. This is due to the fringing electrical field from the sidewalls of poly gate 125 (FIG. 3) which still increases the carrier concentrations in n− region 128 when gate voltage $V_g$ increases, which is why there is still a weak gate bias dependence on quasi-saturation current.

In the present invention, it is desirable to enhance the fringing electrical field by the insertion of an additional region 230 (FIGS. 5A-5B), of one of a high-k material and a conductive material, in order to enhance the gate voltage dependence of quasi-saturation current. The current drivability of the high voltage MOS device 200 can be enhanced without the sacrifice of breakdown voltage downgrade. The quasi-saturation current of a high voltage MOS device 200 can be improved by using a high-k material such as silicon nitride ($S_xN_y$), aluminum oxide ($Al_xO_y$), hafnium oxide ($Hf_xO_y$) or the like or a conductive material such as doped or undoped polysilicon or the like as the additional region 230.

Figure 6:
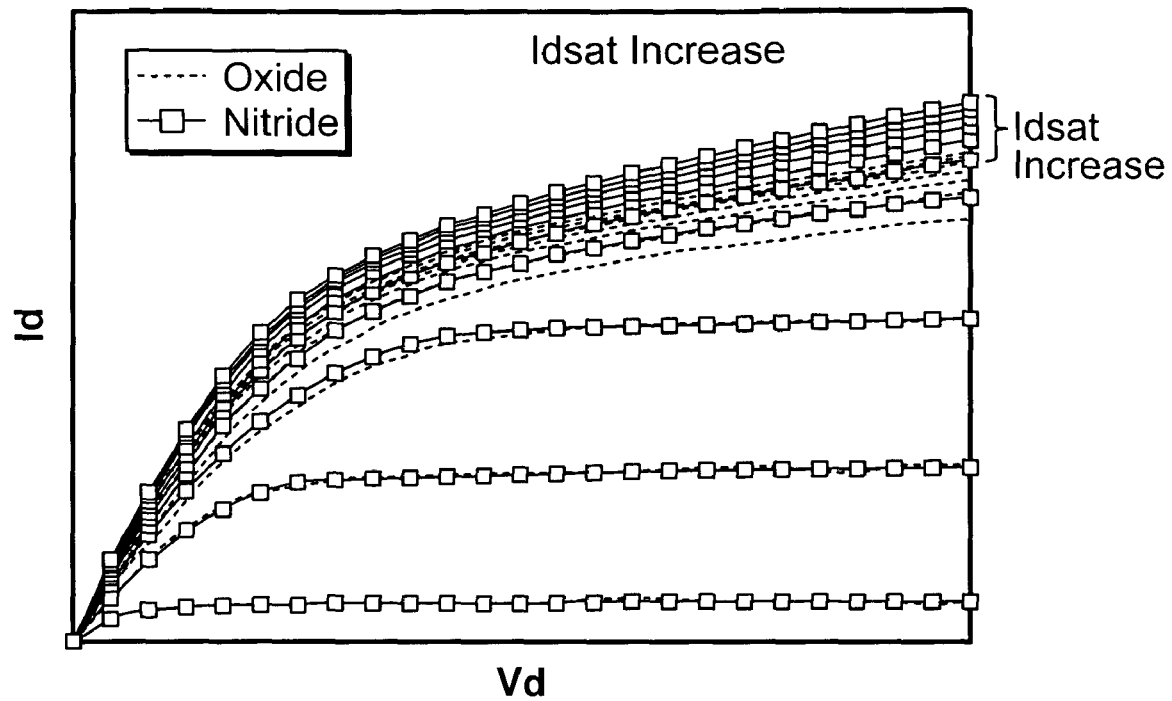
FIG. 6 is a graph of drain current versus drain voltage with increasing gate voltage for a conventional high voltage MOS and the high voltage MOS device with an additional region filled by nitride.

FIG. 6 is a graph of drain current $I_d$ versus drain voltage $V_d$ for a conventional high voltage MOS device 100 having normal oxide fill 111 and the high voltage MOS device 200 with an additional region 230 as shown in FIGS. 5A-5B in accordance with the preferred embodiment of the present invention. As shown in FIG. 6, the high voltage MOS device 200 having the additional region 230 formed of high-k material causes a stronger fringing electrical field than the conventional high voltage MOS device 100, and therefore, there is an increase in quasi-saturation current with increasing gate voltage $V_g$ for the high voltage MOS device 200 as compared to the conventional high voltage MOS device 100.

Figure 7:
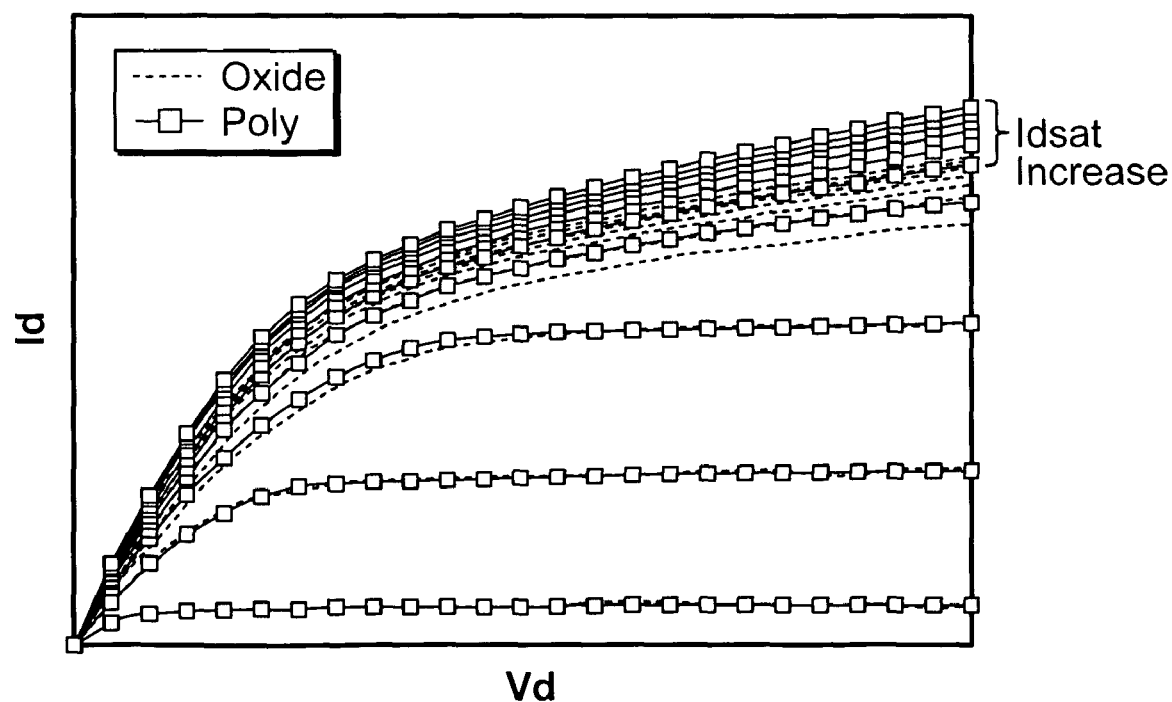
FIG. 7 is a graph of drain current versus drain voltage with increasing gate voltage for a conventional high voltage MOS and the high voltage MOS device with an additional region filled by polysilicon.

The quasi-saturation current of a high voltage MOS device 200 can also be increased when the additional region 230 is a conductive material, such as doped or undoped polysilicon. FIG. 7 is a graph of drain current $I_d$ versus drain voltage $V_d$ for the conventional high voltage MOS device 100 having an oxide fill 111 and the high voltage MOS device 200 having an additional region 230 filled with polysilicon. As shown in FIG. 7, the high voltage MOS device 200 with the additional region 230 formed of polysilicon has much better controllability on the carrier concentration in n− region 226, 228 than the conventional high voltage MOS device 100, and therefore, there is an increase in saturation current with increasing gate voltage $V_g$ for the high voltage MOS device 200 as compared to the conventional high voltage MOS device 100. The quasi-saturation current of a high voltage MOS device 200 can be improved by using an additional region 230 of conductive material such as polysilicon ($Si_x$).

Figure 8:
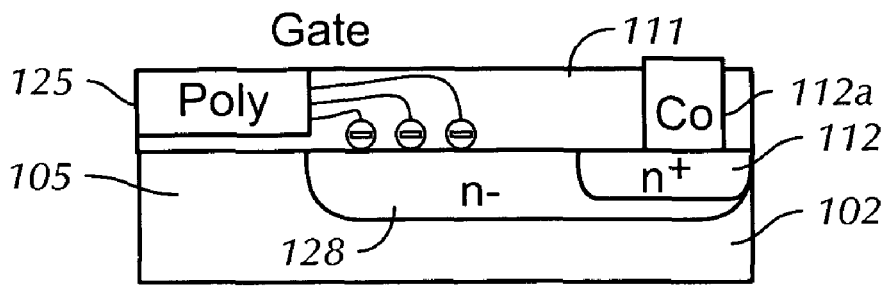
FIG. 8 is a partial elevational cross-sectional view of a prior art high voltage MOS device showing negative charge trapping in an oxide fill after hot carrier stress.
Figure 9:
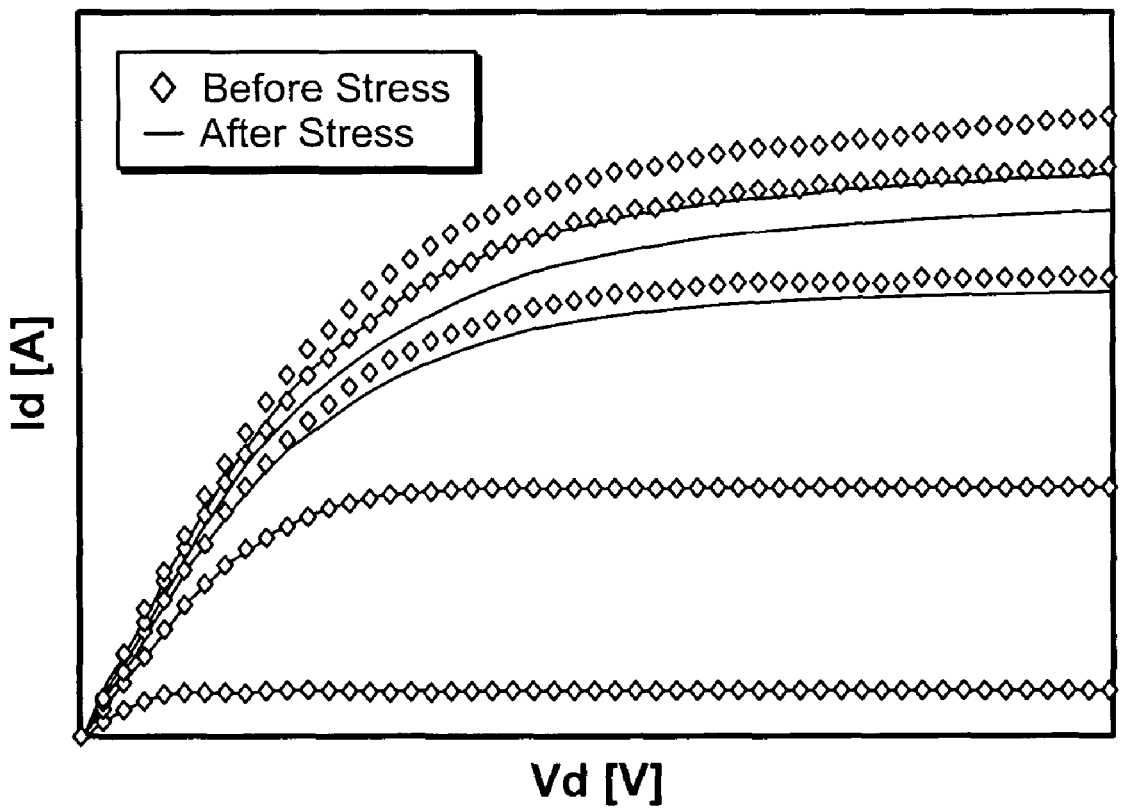
FIG. 9 is a graph of drain current versus drain voltage for the prior art high voltage MOS device of FIG. 8 comparing before and after a hot carrier stress condition with increasing gate voltage.

Saturation current degradation due to hot carrier effect is a serious issue in a high voltage MOS device 100. The prior art high voltage MOS device 100, which has extended n− regions 126, 128, may have hot-carrier-injected election into the oxide above n− region 126, 128 as shown in FIG. 8. The injected electrons will suppress the fringing electrical field from gate edges and then decrease the carrier concentration in n− region 126, 128. in this condition, the quasi-saturation currents will degrade after hot carrier stress as shown in FIG. 9.

Better immunity against hot carrier degradation can also be observed in high voltage MOS device 200 with an additional conductor region 230. When the high voltage MOS device 200 with additional conductor region 230 is used for high voltage operations, the extended poly gate 225 by the additional conductor region 230 still has good controllability on the carrier concentration in n− region 226, 228, even though there are injected electrons resulting from hot carrier stress. Consequently, the high voltage MOS device 200 with additional conductor region 230 may have better immunity from hot carrier stress in addition to better current drivability.

The present invention also includes methods of forming high voltage MOS device 200. One method includes providing the silicon substrate 202 having a main surface 202a. A portion of the semiconductor substrate 202 may be doped for a channel region 205. An oxide layer is formed on the main surface 202a of the substrate 202. Then a gate 225 is formed on the main surface 202a of the silicon substrate 202 by growing or depositing polysilicon and then selectively removing portions of the polysilicon and oxide. A source region 204 is formed in a portion of the silicon substrate 202 proximate the main surface 202a and a drain region 212 is formed in a portion of the silicon substrate 202 proximate the main surface 202a. The source 204 and the drain 212 are preferably formed by selectively doping the main surface 202a. The doping is performed by one of ion implantation, solid diffusion, liquid diffusion, spin-on deposits, plasma doping, vapor phase doping, laser doping and the like. Doping with boron B results in a more p-type region, doping with phosphorus results in a more n-type region and doping with arsenic As results in a more n-type region. Other dopants may be utilized such as antimony Sb, bismuth Bi, aluminum Al, indium In, gallium Ga and the like depending on the material of the substrate 202 and the desired strength of the doping. Preferably, the doping is performed by ion implantation. The partially formed device 200 may then be subjected to a heating step to cause the dopant to sufficiently diffuse into the substrate 202.

The drain region 212 is spaced apart from the source region 204. A channel region 205 is defined in a portion of the silicon substrate 202 proximate the main surface 202a between the source region 204 and the drain region 212 and at least partially beneath the gate 225. A portion of the semiconductor substrate between the gate 225 and the source 204 and between the gate 225 and the drain 212 is lightly doped in a fashion similar to the source 204 and the drain 212. The partially formed device 200 may again be subjected to a heating step to cause the dopant to sufficiently diffuse into the substrate 202. Alternately, both doping steps may take place prior to the diffusion process.

The additional region 230 of high-k material or conductive material is deposited on the main surface 202a of the semiconductor substrate 202. The additional region 230 of high-k material or conductive material is selectively etched so as to leave at least a portion of the high-k material or conductive material, respectively, above the main surface 202a. The etching may be by one of plasma etching, dry etching, Reactive Ion Etching (RIE), chemical etching and the like. A photomask (not shown) or photolithograph (not shown) may be used to select the material to be retained, i.e., not etched, as is known in the art.

When the additional region 230 is formed of a conductive material, such as polysilicon, the additional region 230 cannot directly contact the main surface 202a of the substrate 202, so a dielectric layer, such as an oxide, is preferably deposited on the main surface 202a prior to depositing the conductive material of the additional region 230 onto the semiconductor substrate 202 proximate the channel region 205.

Contacts 204a and 212a are then formed on the source 204 and the drain 212, respectively. The contacts 204a and 212a may be a metal or polysilicon or combinations thereof.

Other processing steps, as is known in the art, may be utilized without departing from the invention. Portions of the silicon substrate 202 or the entire device 200 may have a sacrificial silicon dioxide layer (SiO₂) grown thereon prior and then may be etched using a buffered oxide etch or a diluted hydrofluoric (HF) acid etch or the like to produce smooth surfaces and/or rounded corners. Furthermore, other layers in addition to the additional region 230 may be added as desired. For example, a layer of silicon dioxide (SiO₂) or the like may be deposited or otherwise formed over the gate 225 and the region 230 and portions of the main surface 202a. Furthermore, the conductive semiconductor substrate 202 can be doped, implanted and/or diffused to achieve a particular conductivity.

From the foregoing, it can be seen that the present invention is directed to a high voltage semiconductor device having an additional region of one of high-k dielectric and conductive material disposed proximate its control gate and a method for manufacturing such a high voltage device. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A high-voltage semiconductor device comprising:
    a silicon substrate having a main surface;
    a gate on the main surface of the silicon substrate;
    a source region in a portion of the silicon substrate proximate to the main surface;
    a drain region in a portion of the silicon substrate proximate to the main surface, the drain region being spaced apart from the source region;
    a first lightly doped region in a portion of the silicon substrate proximate to the main surface extending from the gate to the source region so that all of the source region is located within the first lightly doped region;
    a second lightly doped region in a portion of the silicon substrate proximate to the main surface extending from the gate to the drain region, wherein a length of the second lightly doped region is larger than a length of the drain region so that all of the drain region is located within the first lightly doped region, wherein the drain region, the source region, the first lightly doped region and the second lightly doped region have the same conductive type;
    a channel region being defined in a portion of the silicon substrate proximate to the main surface between the source region and the drain region, the channel region being at least partially beneath the gate; and
    an additional region along a sidewall of the gate, in direct contact with the main surface proximate to the channel region and disposed over the second lightly doped region between the gate and the drain region, the additional region being not in contact to the drain region and formed of a high-k material, wherein the additional region is present only on one side of the gate.

2. The high-voltage semiconductor device according to claim 1, wherein the additional region comprises nitride.

3. The high-voltage semiconductor device according to claim 1, wherein the high-k material comprises aluminum oxide or hafnium oxide.

4. The high-voltage semiconductor device according to claim 1, wherein a first distance from the gate to the source is smaller than a second distance from the gate to the drain.

5. The high-voltage semiconductor device according to claim 1, wherein a third distance from the additional region to the gate is smaller than a fourth distance from the additional region to the drain.

6. The high-voltage semiconductor device according to claim 1, wherein a first depth from a top surface to a bottom surface of the first lightly doped region is larger than a second depth from a top surface to a bottom surface of the source region, and a third depth from a top surface to a bottom surface of the second lightly doped region is larger than a forth depth from a top surface to a bottom surface of the drain region.

7. A high-voltage semiconductor device comprising:
    a silicon substrate having a main surface;
    a gate on the main surface of the silicon substrate;
    a source region in a portion of the silicon substrate proximate to the main surface at a first side of the gate;
    a drain region in a portion of the silicon substrate proximate to the main surface at a second side of the gate, the drain region being spaced apart from the source region;
    a first lightly doped region in a portion of the silicon substrate proximate to the main surface extending from the gate to the drain region, wherein a length of the first lightly doped region is larger than a length of the drain region;
    a channel region being defined in a portion of the silicon substrate proximate to the main surface between the source region and the drain region, the channel region being at least partially beneath the gate; and
    an additional region along a sidewall of the gate, in direct contact with the main surface proximate to the channel region, disposed over the substrate between the gate and the drain region, being in contact to the first lightly doped region, not in contact to the drain region, and apart from the gate by a distance, the additional region being formed of a conductive or semiconductor material.

8. The high-voltage semiconductor device according to claim 7, further comprising:
    a second lightly doped region in a portion of the silicon substrate proximate to the main surface extending from the gate to the source region.

9. The high-voltage semiconductor device according to claim 7, wherein the additional region comprises one of doped polysilicon and undoped polysilicon.

10. The high-voltage semiconductor device according to claim 7, wherein a first distance from the gate to the source is smaller than a second distance from the gate to the drain.

11. The high-voltage semiconductor device according to claim 7, wherein a third distance from the additional region to the gate is smaller than a fourth distance from the additional region to the drain.

* * * * *